United States Patent [19]
Stevenson

[11] Patent Number: 5,421,979
[45] Date of Patent: Jun. 6, 1995

[54] LOAD-LOCK DRUM-TYPE COATING APPARATUS

[75] Inventor: David E. Stevenson, Northfield, Minn.

[73] Assignee: Photran Corporation, Lakeville, Minn.

[21] Appl. No.: 101,614

[22] Filed: Aug. 3, 1993

[51] Int. Cl.⁶ ............................................. C23C 14/56
[52] U.S. Cl. .......................... 204/298.25; 204/298.28; 118/730; 118/733; 414/217; 414/221
[58] Field of Search ...................... 204/298.25, 298.26, 204/298.28; 118/719, 730, 733, 50, 50.1; 414/217, 221

[56] References Cited
U.S. PATENT DOCUMENTS
3,856,654 12/1974 George ........................ 204/298.25

OTHER PUBLICATIONS
C. H. George, *J. Vac. Sci. Technol.*, vol. 10, No. 2, Mar.-/Apr. 1973, pp. 393–397.

*Primary Examiner*—Aaron Weisstuch
*Attorney, Agent, or Firm*—R. Russel Austin

[57] ABSTRACT

Vacuum coating apparatus (30) includes a coating chamber (32), and a load-lock chamber (34) connected to the coating chamber via a high vacuum valve (44). The coating chamber includes deposition-devices (123) and a cylindrical or drum shaped substrate-transporter (100) for transporting substrates (64) past the deposition-devices. Substrates are carried on substrate-carriers (66) which are configured to fit into transport-stations (102) around the periphery of the substrate-transporter. A magazine (61) holding a plurality of substrate-carriers is located in the load-lock chamber. An injector arrangement (120) is provided for ejecting a substrate-carrier from the magazine, transporting the substrate-carrier through the high vacuum valve, and inserting the substrate-carrier into a transport-station of the substrate-carrier.

4 Claims, 14 Drawing Sheets

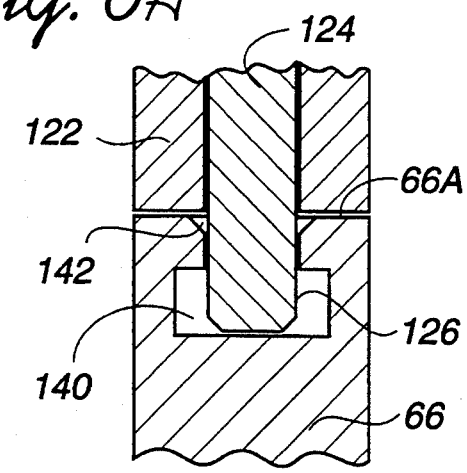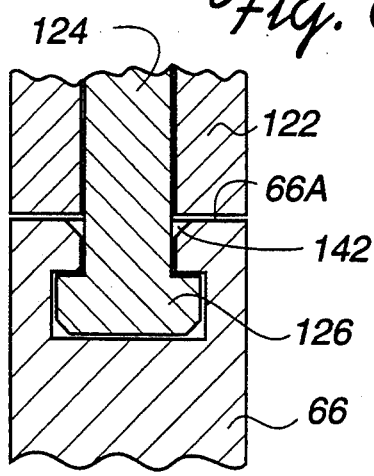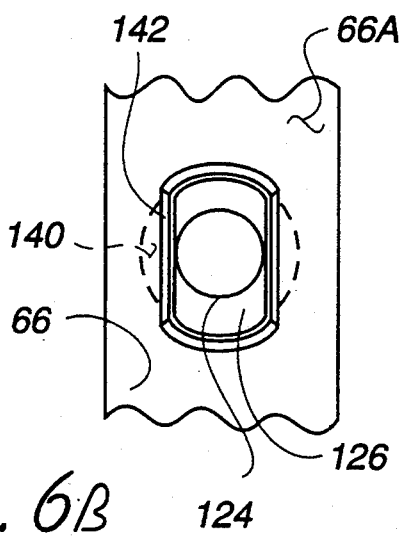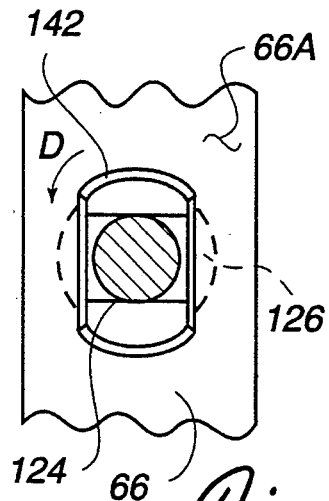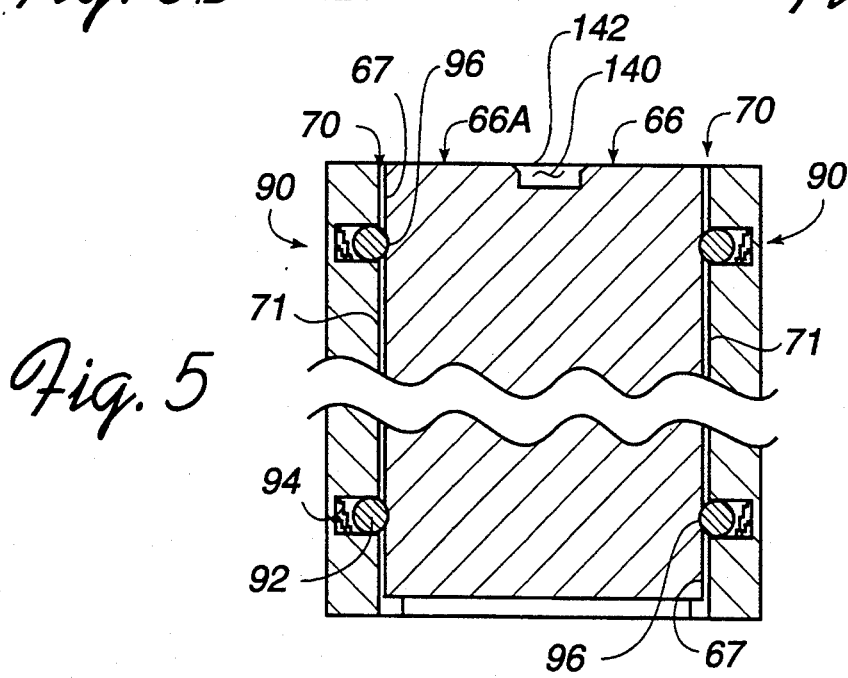

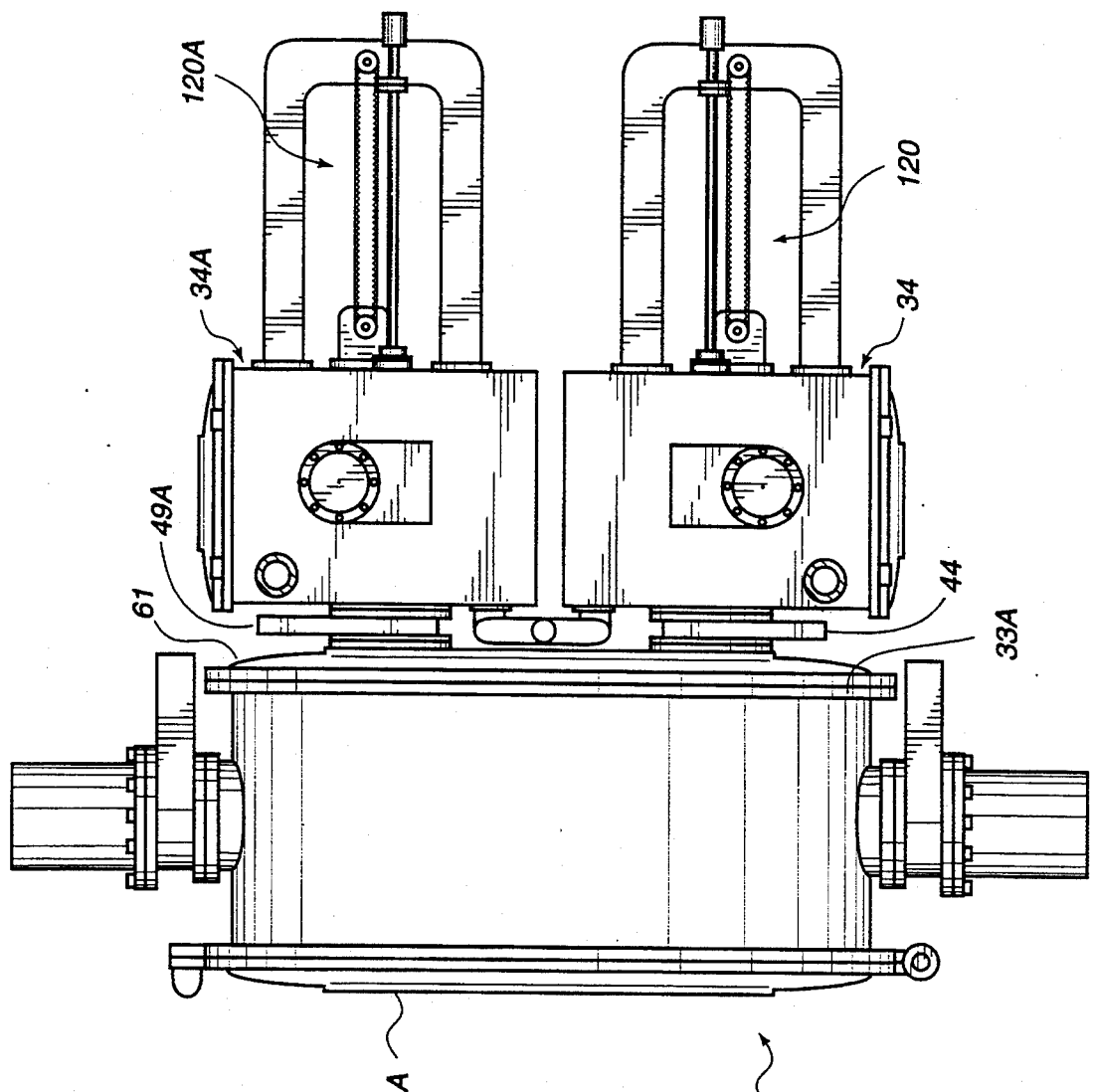

LOAD-LOCK DRUM-TYPE COATING APPARATUS

TECHNICAL FIELD OF THE INVENTION

The present invention relates generally to vacuum coating apparatus. It relates in particular to a magazine-type load-lock coating apparatus wherein substrates are arranged on carriers arranged around the periphery of a rotatable cylinder or drum.

DISCUSSION OF BACKGROUND ART

A useful configuration for vacuum coating apparatus includes a plurality of substrate-carriers arranged around the periphery of a rotatable cylinder or drum. Material is deposited on the substrates from elongated linear deposition sources, preferably sputtering cathodes, arranged adjacent the drum.

In one convenient arrangement, the drum may be contained, vertically oriented, in a box-type vacuum chamber having linear dimensions not significantly greater than the diameter and height of the drum. A linear magnetron sputtering cathode may be located in each corner of the chamber. Each cathode may be used to deposit a different material for depositing multilayer devices. Alternatively, one or more cathodes may be used to deposit the same material for the purpose of increasing deposition rate of that material on the substrates.

The above discussed drum-type coating apparatus has numerous advantages over more conventional coating apparatus wherein substrates are arranged on a horizontally oriented rotatable disc, or a series of discs rotatable in a planetary fashion.

The drum-type coating apparatus allows a large area of substrate to be coated in a relatively small chamber. The drum-type coating apparatus allows a very high degree of layer thickness uniformity to be achieved. Layers are deposited by multiple passes of substrates past the deposition sources. By depositing two materials, each from a different source, a mixture of the two materials may be effectively deposited.

In certain aspects, a drum-type coating apparatus has the advantages of an in-line type coating apparatus. A particular advantage is that linear magnetron sputtering sources may be effectively used as deposition sources, as they are, almost universally, in in-line sputtering apparatus. Linear magnetrons provide excellent deposition uniformity, and they may be operated for periods of days without maintenance. A linear magnetron equipped, drum-type coating apparatus may be though of, in effect, as a "cylindrical in-line" coating apparatus.

A particular disadvantage of the drum-type coating apparatus, however, is that it is not readily arranged as a load-lock type apparatus. In a load-lock coating apparatus, a coating chamber is held permanently (at least between maintenance intervals) under vacuum, and substrates are passed into and out of the chamber via exhaustable vacuum locks connected by a valve to the coating chamber. A load-lock type apparatus has an advantage that lengthy time periods are not required for exhausting and venting the chamber between coating cycles. Further, maintenance of the coating chamber under vacuum provides for reduced cosmetic defects in coated substrates. Such defects may be numerous in a coating apparatus in which the coating chamber is constantly vented and exhausted, thereby stirring up particulate matter which accumulates in the chamber between maintenance periods.

In in-line coating apparatus, a single flat substrate-carrier holds substrates to be coated. The flat nature of the substrate allows it to be passed conveniently through slit valves or locks into and out of a coating chamber. In-line apparatus has been used effectively for providing relatively sophisticated coatings at low cost. Achieving this low cost requires that a substantial area of a single layer system be produced. As such, apparatus is effectively used for providing architectural coatings.

In a revolving horizontal disc type coating apparatus, substrates may be essentially dropped through a valve or lock onto the disc for coating. In a revolving disc type apparatus the area of substrate which can be coated in a single charge is relatively limited. Because of this, a coating produced in such apparatus may be up to two orders of magnitude more expensive the same coating produced (volume considerations aside) in an architectural-scale in-line coating apparatus.

A load-lock, cylindrical in-line coating apparatus would be particularly useful for providing relatively low cost coatings without a requirement for architectural-scale product areas to achieve the relatively low cost. By way of example, one particular area in which such apparatus may be usefully applied, is in providing anti-reflection coatings for eye-glass lenses. The cost of such coatings is presently such that it is prohibitive for a majority of spectacle wearers.

The load-lock configurations presently used for disc-type or for in-line coating apparatus are not convenient in a drum-type coating apparatus. Dropping a substrate through a vacuum lock onto a drum is clearly not practical. Passing an entire drum loaded with substrates through a lock, would require a vacuum valve having dimensions greater than the drum. As a common drum dimension in drum-type coating apparatus may be between about 0.8 and 1.2 meters (m) in diameter and height, a vacuum valve (a gate-type valve) having an aperture of at least about 1.0 m would be required to accommodate passage of the drum. While construction of such a valve would not be impossible, it would certainly be a complex and expensive task. The cost of such a specially constructed valve would probably dominate the cost of constructing such apparatus. Further, a preferred apparatus would include separate load and un-load-locks. This would necessitate two such expensive valves.

Providing a load-lock cylindrical coating apparatus requires a new and different approach to loading and unloading substrates into the apparatus through vacuum locks.

SUMMARY OF THE INVENTION

It is an object of the present invention to provide a load-lock, drum-type coating apparatus which may be constructed using standard, gate-type, valves having a small aperture relative to the size of the drum.

The above and other objects of the present invention are provided by a vacuum coating apparatus which comprises first and second vacuum chambers in fluid communication with each other via first valve means therebetween. The first chamber includes at least one deposition-device for depositing a coating material, and a drum-shaped or cylinder-shaped substrate-transporter for transporting substrates past the deposition-device to receive the coating material.

The substrates are carried on substrate-carriers, each substrate-carrier configured to fit into one of a plurality of transport-stations located around the periphery of the substrate-transporter. A magazine arrangement is located in the second chamber for holding a plurality of the substrate-carriers.

An injector arrangement is provided for removing a selected one of the substrate-carriers from the magazine arrangement, transporting the selected substrate-carrier through the valve means, and inserting the selected substrate-carrier into a selected one of the-transport-stations.

In one preferred embodiment of the present invention, a vacuum coating apparatus comprises first and second vacuum chambers having respectively first and second apertures therein. The first and second apertures are generally aligned with each other and in fluid connection with each other via valve means therebetween.

A cylinder-shaped substrate-transporter is located in the first vacuum chamber. The substrate-transporter is rotatable about a cylindrical axis. The substrate-carrier includes a plurality of elongated transport-stations, arranged peripherally therearound, and aligned generally parallel to the cylindrical axis. The first aperture is located in the first vacuum chamber such that a selected one of the transport-stations may be generally aligned therewith by rotating the substrate-transporter.

Means are located in the second chamber for releasably holding a plurality of generally flat, rectangular, elongated substrate-carriers, each thereof for holding a predetermined number of substrates to be coated.

Also located in the second vacuum chamber are means for moving a selected one of the substrate-carriers into alignment with the selected transport-station. Injection means are provided for removing the selected substrate-carrier from the holding means, transporting the selected substrate-carrier through the second and first apertures, and inserting the selected substrate-carrier into the selected transport-station.

The injection means may further include means for removing the selected substrate-carrier from the selected coating transport-station, transporting the selected substrate-carrier through the first and second apertures, and replacing the selected substrate-carrier into the holding means.

The apparatus may further include a third vacuum chamber. The third vacuum chamber is in fluid connection with the first vacuum chamber, via a third aperture in the first vacuum chamber and a fourth aperture in the third vacuum chamber. Second valve means connects the third and fourth apertures. The third and fourth apertures are generally aligned with each other, and the third aperture is located in the first vacuum chamber such that a selected one of the transport-stations may be generally aligned with the third and fourth apertures by rotating the substrate-transporter.

The third vacuum chamber includes magazine means for releasably holding a plurality of the above described substrate-carriers, including a plurality of the above described spaced-apart elongated holding-stations.

The third vacuum chamber includes means for transporting the second magazine means across the fourth aperture such that a selected one of the holding-stations therein may be aligned with the selected transport-station including the substrate-carrier. Withdrawal means are provided in the third vacuum chamber for removing the substrate-carrier from the selected transport-station, transporting the substrate-carrier through the third and fourth apertures, and inserting the substrate-carrier into the selected holding-station.

The second and third vacuum chambers may be positioned on the first vacuum chamber such that substrate-carriers may be loaded into the substrate-transporter from the first chamber and unloaded from the substrate-transporter into the second coating chamber.

The first vacuum chamber is equipped with one or more deposition-devices for depositing a selected coating material on the substrates. Preferred deposition-devices are elongated magnetron sputtering-devices, which may be of the linear planar or rotatable cylindrical type.

In one aspect of the present invention, the apparatus may be operated by locating substrate-carriers around the entire periphery of the substrate-transporter, activating a deposition-device, and rotating the substrate-transporter such that substrates are transported repeatedly past the deposition source to receive a layer of the selected coating material.

In another aspect of the present invention, at least two deposition-devices are provided, one thereof for depositing a first coating material and the other for depositing a second coating material. The deposition-devices are located proximate one half of the periphery of the substrate-transporter. Substrate-carriers are located only on the other half of the periphery of the substrate-transporter when it is in a starting position. The two deposition sources are activated and the substrate-transporter is rotated slowly, once, through three-hundred-sixty degrees (360°) and returned to the starting position. Substrate-carriers thus move once past both deposition sources receiving a layer of each of the first and second coating materials.

A plurality of deposition sources may be arranged adjacent the one half of the periphery. A selected coating material is deposited by each of the sources, such that a coating having a predetermined multilayer structure is deposited on the substrate-carriers in one 360° rotation of the substrate-carrier.

The above-described vacuum chambers may be configured such that the substrate-transporter is arranged with the cylindrical axis thereof generally vertically oriented, such that substrate-carriers must be inserted into and removed from the transporter in a vertical motion. Alternatively, the transporter may be arranged with the cylindrical axis thereof generally horizontally oriented, such that substrate-carriers must be inserted into and removed from the transporter in a horizontal motion.

In this latter configuration, the second and third vacuum chambers may be arranged to connect with the first vacuum chamber at opposite ends thereof. In this configuration, substrate-carriers may be loaded into the substrate-transporter at one end thereof, and removed from the transporter at the other end thereof.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIG. 5 is a cross section views seen generally in the direction 5—5 of FIG. 4 schematically illustrating means for releasably holding a substrate-carrier in the magazine of FIG. 4.

FIGS. 6A and 6C are cross section views seen generally in the direction 6A—6A of FIG. 4 schematically illustrating an injector shaft locking mechanism for a substrate-carrier in the magazine of FIG. 4.

FIGS. 6B and 6D are cross section views seen generally in the direction 6B—6B of FIG. 4 schematically illustrating further details of the injector shaft locking mechanism of FIGS. 6A and 6C.

FIG. 11 is a plan view schematically illustrating still another embodiment of coating apparatus in accordance with the present invention, including a horizontal cylindrical coating chamber and two load-lock chambers each located at the same end of the coating chamber.

DESCRIPTION OF PREFERRED EMBODIMENTS

Figure 1:
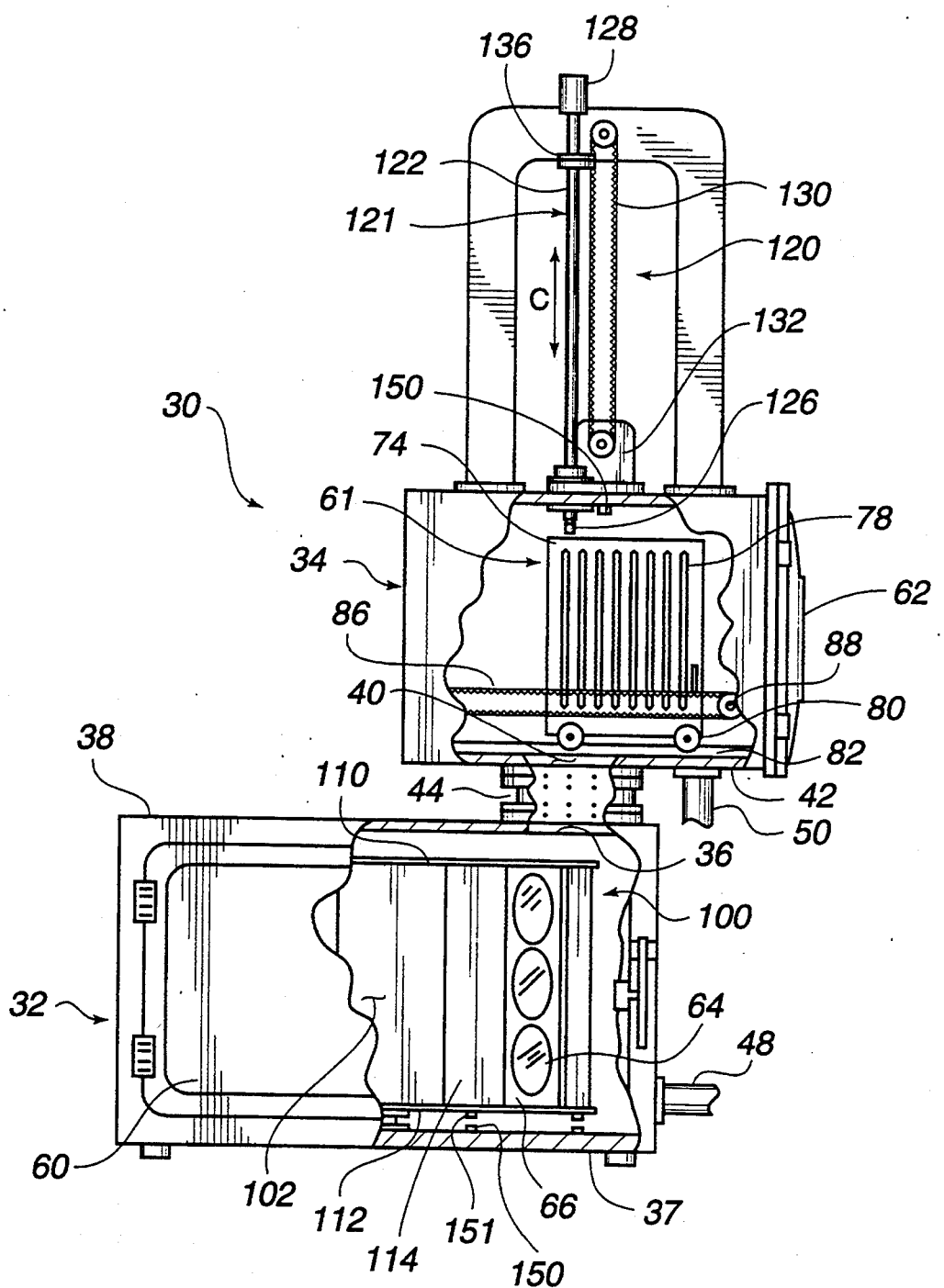
FIG. 1 is a cut-away front elevation view schematically illustrating one embodiment of a coating apparatus in accordance with the present invention, including a coating chamber and one load-lock chamber.
Figure 2:
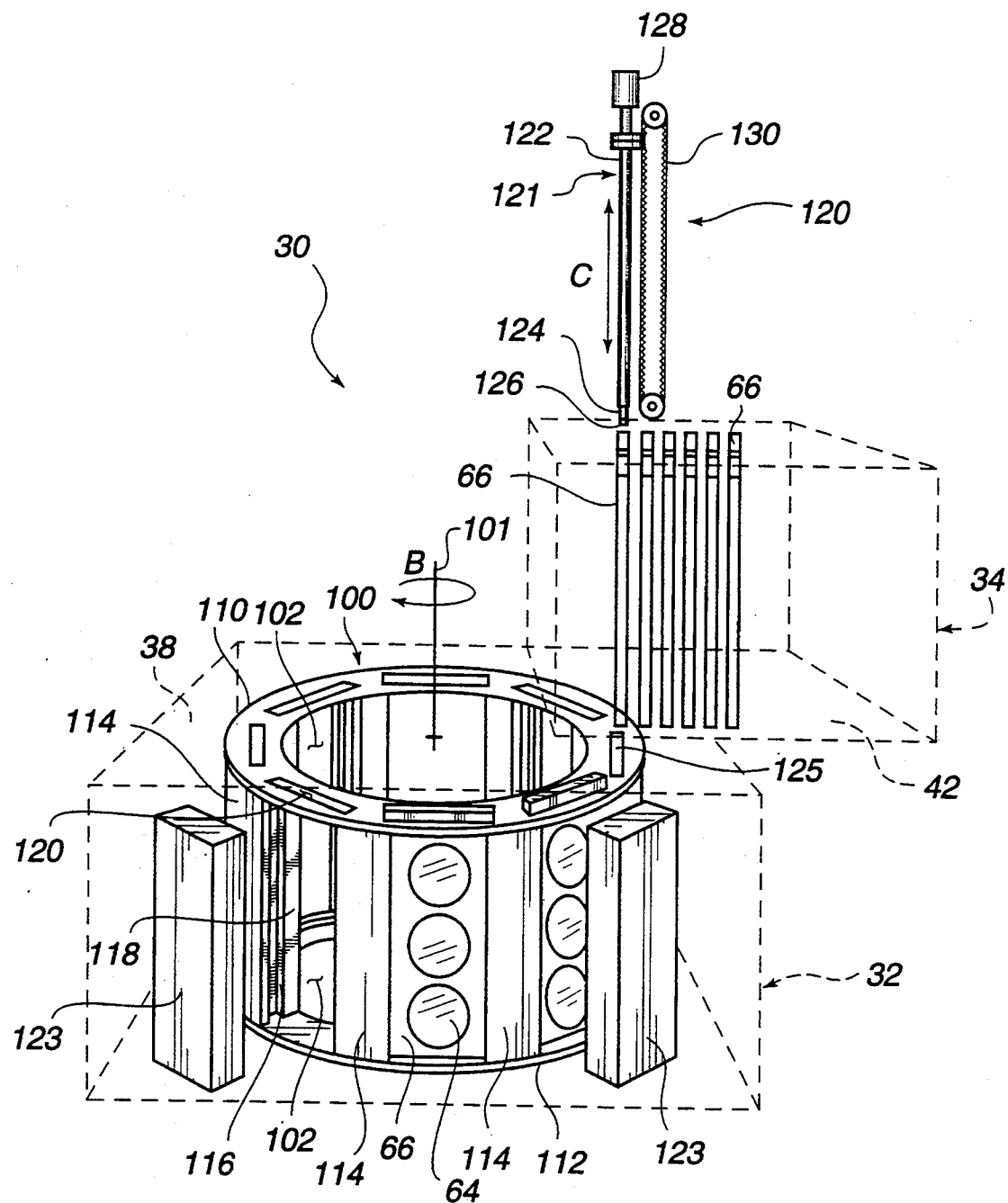
FIG. 2 is an exploded perspective view schematically illustrating details of the apparatus of FIG. 1.
Figure 3:
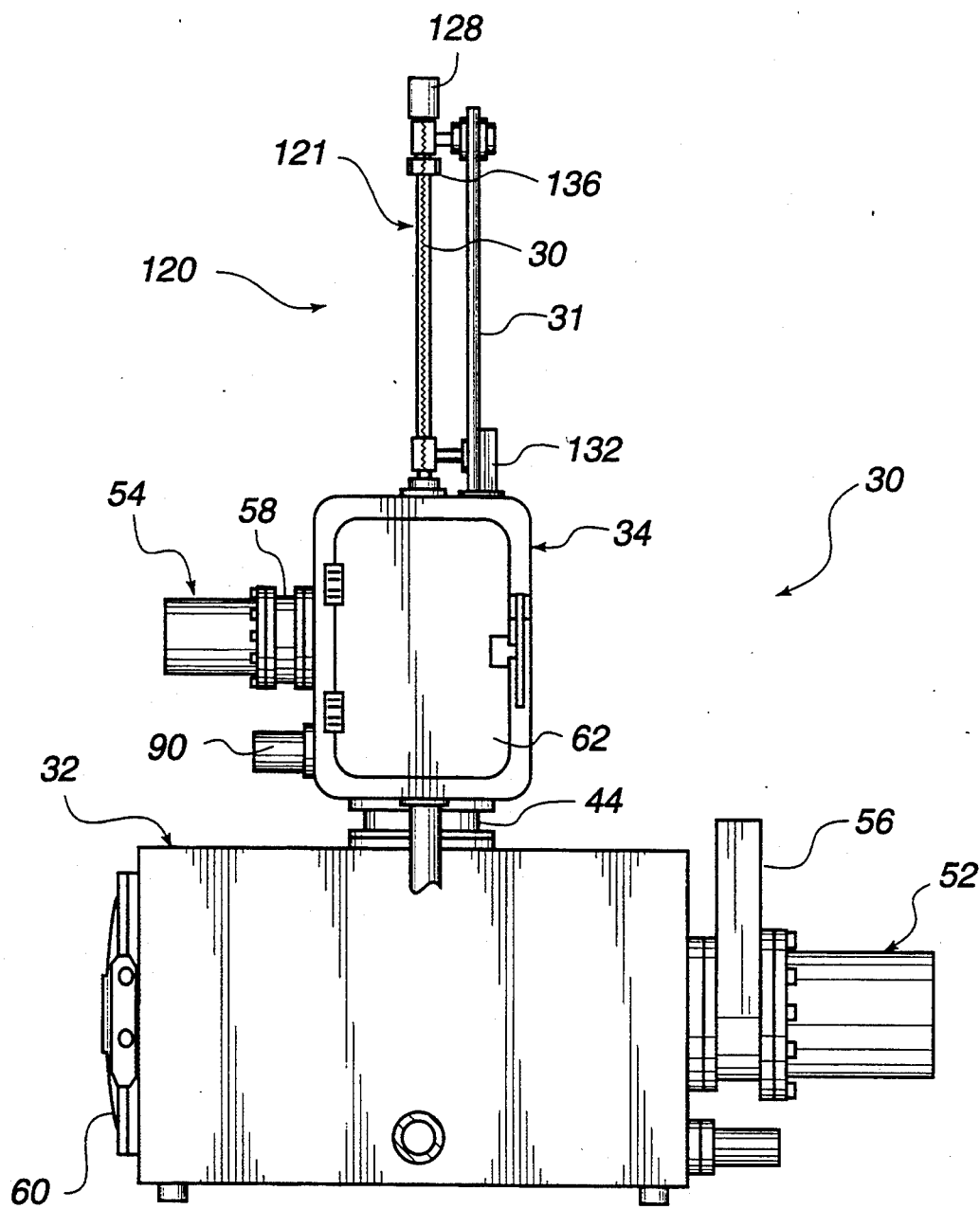
FIG. 3 is an end elevation view schematically illustrating the apparatus of FIG. 1.

Turning now to the drawings, wherein like components are designated by like reference numerals, FIGS. 1, 2, and 3 show one preferred embodiment 30 of coating apparatus in accordance with the present invention.

Coating apparatus 30 includes one vacuum chamber 32 which functions as a coating chamber, and another vacuum chamber 34 which functions as a load-lock chamber. An aperture 36 in upper wall 38 of chamber 32 is aligned with an aperture 40 in base 42 of chamber 34. Apertures 36 and 40 are connected together by high vacuum valve means 44, preferably a high vacuum gate-valve.

Chambers 32 and 34 maybe separately rough-pumped, for example via mechanical pumps (not shown) connected to ports 48 and 50, respectively. Chambers 32 and 34 may be separately fine-pumped (high vacuum pumped), for example by cryogenic pumps 52 and 54, respectively (see FIG. 3). Pumps 52 are 54 are connected to chambers 32 and 34 by high vacuum gate-valves 56 and 58, respectively.

Chamber 32 is preferably provided with an access door 60 to facilitate cleaning and maintenance of the chamber and internal components thereof. Chamber 34 is provided with a door 62 for loading and unloading substrates to be coated.

When valve 44 is open apertures 36 and 40 (and chambers 32 and 34) are in fluid communication with other. When valve 44 is closed chamber 32 is sealed or isolated from chamber 34. This permits chamber 34 to be opened for loading or unloading substrates while maintaining chamber 32 under vacuum.

Figure 4:
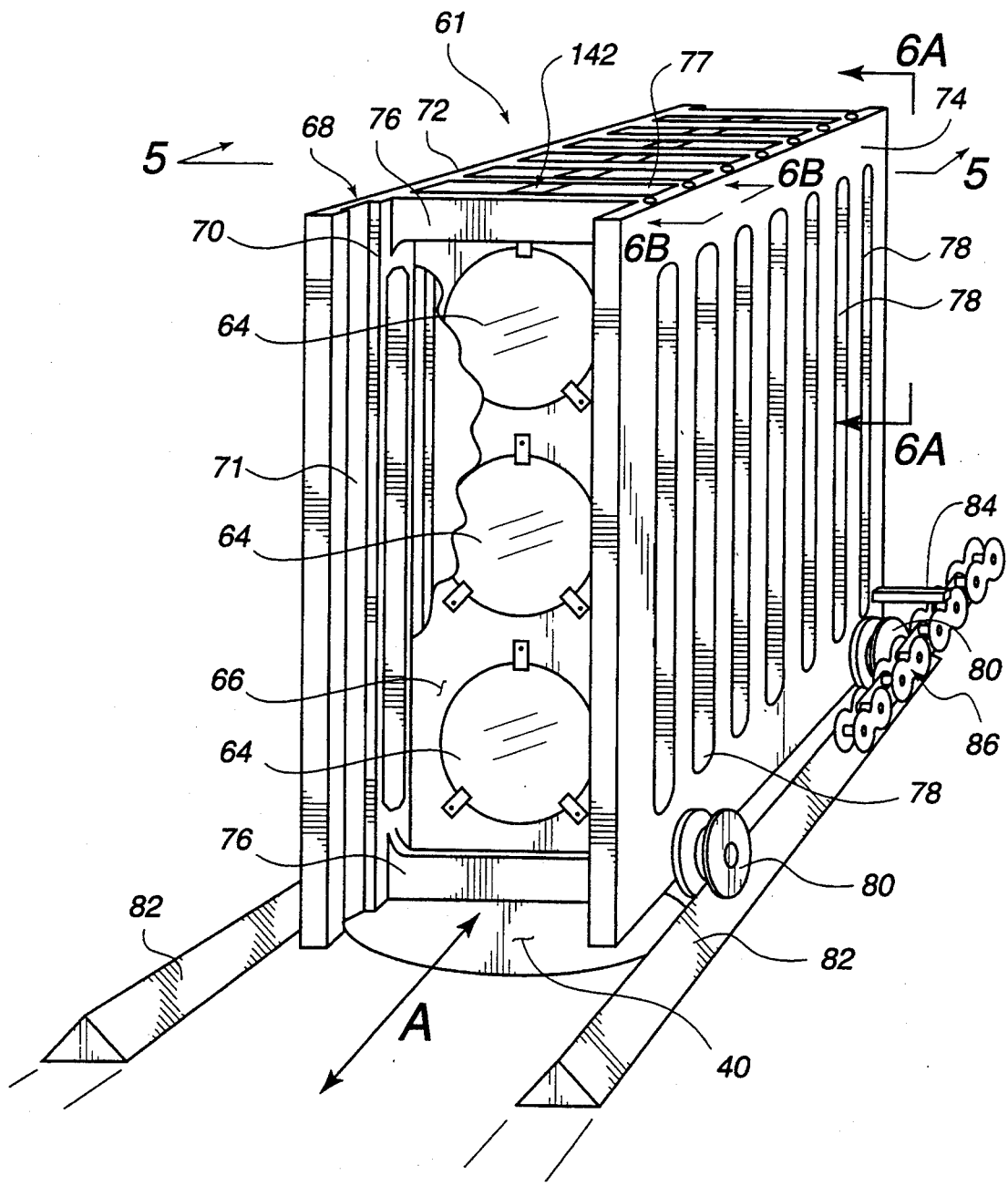
FIG. 4 is a perspective view schematically illustrating a substrate-carrier magazine for the apparatus of FIG. 1.

FIG. 4 shows one embodiment of a magazine arrangement 61 for holding substrates to be coated, i.e., to be loaded into chamber 32 for coating. Substrates 64 are held in elongated rectangular substrate-carriers 66. Magazine 61 includes a plurality of spaced-apart elongated holding-stations 68 (only one visible in FIG. 4), each thereof for releasably holding one substrate-carrier 66. Each holding-station is formed by aligned grooves 70 in opposite sidewalls 72 and 74 of magazine 61. Sidewalls 72 and 74 are attached together and spaced apart by spacer-members 76 at the top and bottom of walls 72 and 74. Spacer-members 76 are attached between each holding-station. Preferably, elongated rectangular slots 78 are provided in side-walls 72 and 74 between each holding-station 70 for facilitating vacuum pumping of chamber 34 when magazine 61 is installed therein.

Magazine 61 is provided with grooved wheels 80 configured to run on parallel rails 82 attached to base 42 of chamber 34. Magazine 61 may be attached by a clip 84 to a chain drive 86. Chain drive 86 is driven by a pulley 88 attached via suitable gearing (not shown) to a drive motor 90 (see FIGS. 1 and 3). Chain drive 86 is used to drive magazine 61 in a forward and reverse directions indicated by arrow A (see FIG. 4).

In FIG. 5, one method of releasably holding a substrate-carrier 66 in a holding-station 68 of magazine 70 is shown. Here, a ball-indent mechanism 90 includes spring loaded balls 92 retained in blind holes 94 in bases 71 of opposite slots 70. A substrate-carrier 66 includes indents 96, in each edge 67 thereof, for engaging balls 90. Preferably, groove 70 includes at least two ball-indent mechanisms, one located at each end of the slot. Each edge of each substrate-carrier includes two indents 67 cooperative with the ball-indent mechanisms.

Continuing now with particular reference to FIG. 2, chamber 32 includes a generally cylindrical or drum shaped substrate-transporter 100, rotatable about a cylindrical axis 101 as indicated by arrow B. Substrate-transporter 100 includes a plurality of elongated transport-stations 102 arranged peripherally therearound, and aligned generally parallel to cylindrical axis 101. Each transport-station 102 is configured to hold a substrate-carrier 66.

In one preferred embodiment substrate-transporter 100 includes upper and lower annular members 110 and 112, respectively, connected together and spaced apart by generally rectangular longitudinal members 114. A transport-station includes elongated grooves 116 extending in a face-to-face manner along facing edges 118 of adjacent longitudinal members 114. Upper longitudinal member 110 includes generally rectangular slots 125. Each slot is aligned with and extends between face to face grooves for guiding a substrate-carrier 66 into the grooves. Deposition sources 123, preferably linear magnetron sputtering-devices, are located proximate substrate-transporter 100.

Continuing with reference to FIGS. 1–3, and additionally to FIGS. 6A–6D, a preferred embodiment of an injector arrangement 120, for ejecting a substrate-carrier 66 from magazine 61 and inserting the carrier into a transport-station 102 is depicted. Injector mechanism 120 includes injector shaft assembly 121. Injector shaft assembly 121 includes a hollow outer shaft 122. Extending through outer shaft 122 is an inner shaft 124. Inner shaft 124 has attached to one end thereof an elongated locking-key 126. The other end of inner shaft 124 is driven by an indexing-motor 128 which is attached outer shaft 122. A drive chain 130, attached by a clamp 136 to outer shaft 122, drives injector shaft assembly 121 up and down in a direction indicated by arrow C. Indexing-motor 128 is able to rotate shaft 124 within shaft 122 and hence rotate locking-key 126 with respect to shaft 122.

Substrate-carrier 66 includes a generally cylindrical injector shaft locking chamber 140 located proximate the top edge 66A thereof. Access for locking-key 126 is provided by an elongated slot 142 having generally the same shape as locking-key 126 but being sufficiently larger that the key may pass freely through the slot when aligned therewith.

Set forth below is one example of a sequence of events which are required to remove a substrate-carrier 66 from magazine 61, move the carrier through apertures 40 and 36, and insert the substrate-carrier into a selected transport-station 102 in substrate-transporter 100.

With chambers 32 and 34 under vacuum, valve 44 (see FIG. 1) is opened. Substrate-transporter 100 is rotated about axis 101 to position a selected transport-station 102 under aperture 36 of chamber 32. Magazine 61 is driven along rails 82 such that a selected substrate-carrier therein is moved across aperture 40 of chamber 34, into alignment with the selected transport-station. From a starting position illustrated in FIG. 1, and with locking-key 126 aligned with slot 142 of the selected substrate-carrier 66, injector shaft assembly 121 is driven downward by chain drive 130 until key 126 is inserted through slot 142 into locking chamber 140 of the substrate-carrier (see FIGS. 6A and 6B). Indexing-motor 128 is then activated to rotate inner shaft 124 of injector shaft assembly 121, and thus locking-key 126, through an angle of about 90° in the direction indicated by arrow D (see FIGS. 6C an 6D) thus locking injector shaft assembly 121 to the substrate-carrier.

Injector shaft assembly 121 is then driven downward, overcoming the resistance of ball-indent mechanisms 90 (FIG. 5). The injector shaft assembly then moves the substrate-carrier through apertures 40 and 36 and inserts the substrate-carrier into the selected transport-station 102. Once the substrate-carrier is inserted into the transport-station, shaft 124 is rotated a further 90° to realign locking-key 126 with slot 142 of the substrate-carrier. Shaft assembly 121 is then withdrawn by chain drive 130, through apertures 36 and 40, and through magazine 66 into the starting position.

The above-described procedure may be repeated until each substrate-carrier from magazine 66 has been inserted into a transport-station of substrate-carrier 100. This having been accomplished, coating operations may be carried out in chamber 32. Once coating operations are complete, an unloading sequence for substrate-carriers 66 in chamber 32 may take place as follows.

A selected transport-station 102 including a substrate-carrier is aligned under aperture 36 of chamber 32, and a selected holding-station 68 of magazine 66 is moved across aperture 40 of chamber 34 into alignment with the transport-station. Injector shaft assembly 121 is driven downwards through magazine 66 and apertures 40 and 36, and key 126 is inserted into locking chamber of the substrate-carrier. Shaft 124 is rotated to lock shaft 122 to the substrate-carrier.

Injector shaft assembly 121 is the raised by chain drive 130 moving the substrate-carrier through apertures 36 and 40 into magazine 61 where it may be held by ball-indent mechanisms 90. Shaft 124 is rotated a further 90° and shaft assembly 121 is withdrawn to the starting position.

The above-described sequence may be repeated until all of the substrate-carriers are removed from substrate-transporter 100 and replaced in magazine 61. Valve 44 may then be closed and chamber 34 vented to atmospheric pressure such that magazine 61, and coated substrates therein, may be removed from apparatus 30, while still maintaining chamber 32 under vacuum.

It will be evident from the above description that mechanisms for driving magazine 61, and substrate-transporter 100 must provide that the magazine be movable in a step-wise fashion, for aligning holding-stations and transport-stations to permit transfer of a substrate-carrier between the holding-station and the transport-station. One method of doing this is to provide motors with shaft encoders for determining drive position, and providing suitably coded instructions from a microprocessor to allow alignment to be controlled and carried out automatically. Such step-wise driven systems are well known to those familiar with the design and construction of servo driven systems, accordingly details of such a drive system for apparatus 30 is not presented here.

An additional safeguard for ensuring alignment may be provided by incorporating one or more optical sensors on substrate-transporter 100 and on magazine 61. Examples of such sensors are illustrated in FIGS. 1 and 3. In FIG. 1 an optical sensor system which includes a transmitter/receiver 150, preferably including coaxial optical fibers (not shown), is located on base 37 of chamber 32. A reflector 151 is positioned on lower annular-member 112 of substrate-transporter 100. An optical signal, for example from a light-emitting diode, may be transmitted from transmitter 150. When reflector 151 is aligned with transmitter/receiver 150, a reflected signal will be received by transmitter/receiver 150 and may be used to stop rotation of substrate-transporter 100.

Referring to FIGS. 1 and 4, a similar arrangement may be used to stop motion of magazine 61. Here, a transmitter/receiver 150 is attached to roof of chamber 34. A reflector 77 is positioned proximate each holding-station 68. When transmitter/receiver 150 is aligned with a reflector 77, the reflected signal detected by the transmitter/receiver may be used to stop motion of magazine 61.

The above-described apparatus 30 is an embodiment of the present invention wherein substrate-transporter 100 is vertically oriented, and coating chamber 32 is in a box or cube-type configuration. This is a popular configuration for coating chambers having a largest external dimension on the order of about one meter. Substrates are loaded and unloaded from a common load-lock chamber 34.

A discussion of certain other useful embodiments of the present invention is set forth below. In each embodiment described and depicted, the magazine arrangement and the substrate-carrier injection mechanism are assumed to be similar to magazine 61 and injection mechanism 120 of apparatus 30. Accordingly, operation of these mechanisms is not discussed in detail, in order to avoid repetition. In drawings, these mechanisms and all other apparatus features which have been discussed in detail above are designated only by a general reference numeral.

Figure 7:
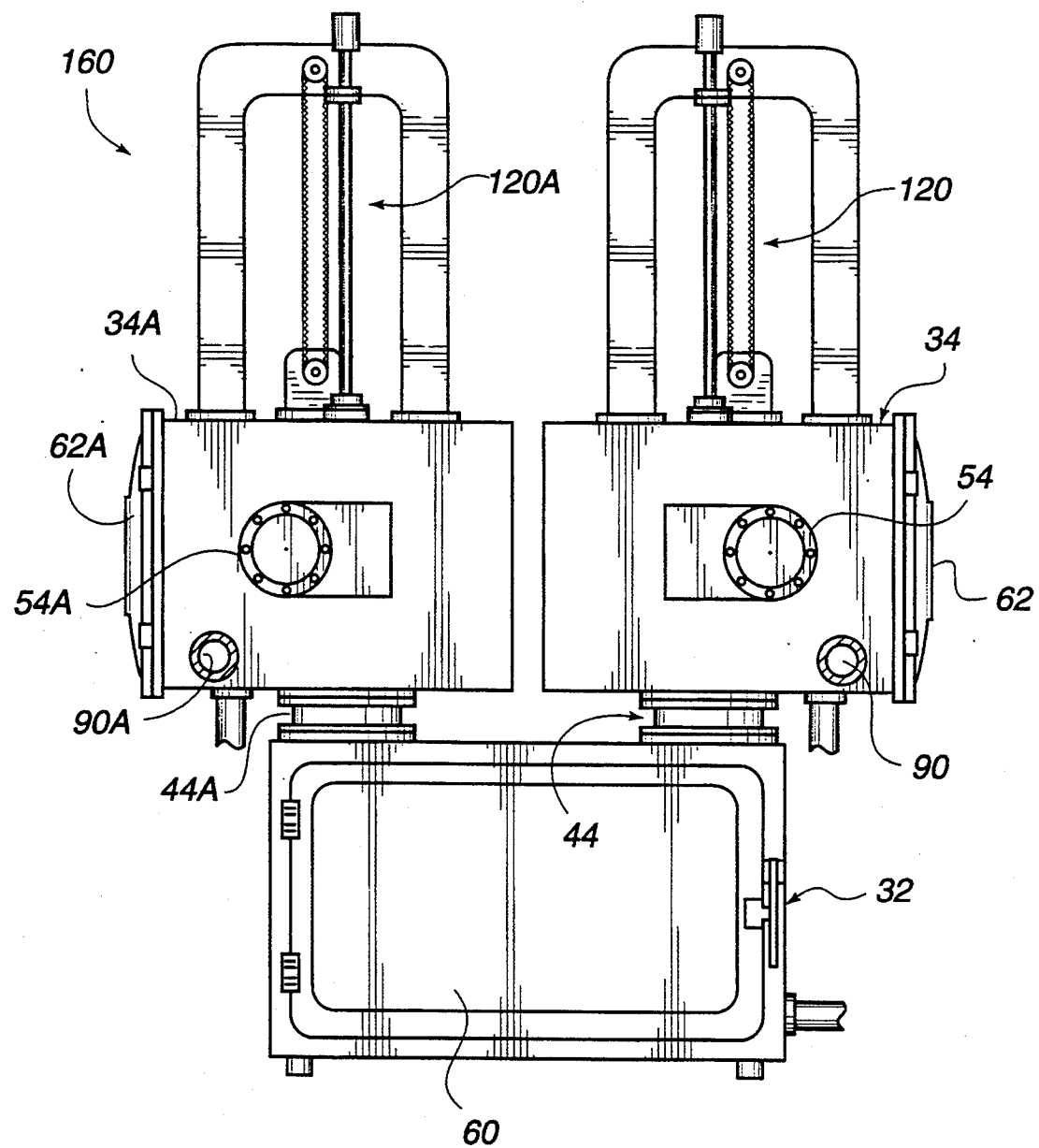
FIG. 7 is a front elevation view schematically illustrating another embodiment of coating apparatus in accordance with the present invention, including a coating chamber and two separate load-lock chambers.
Figure 8:
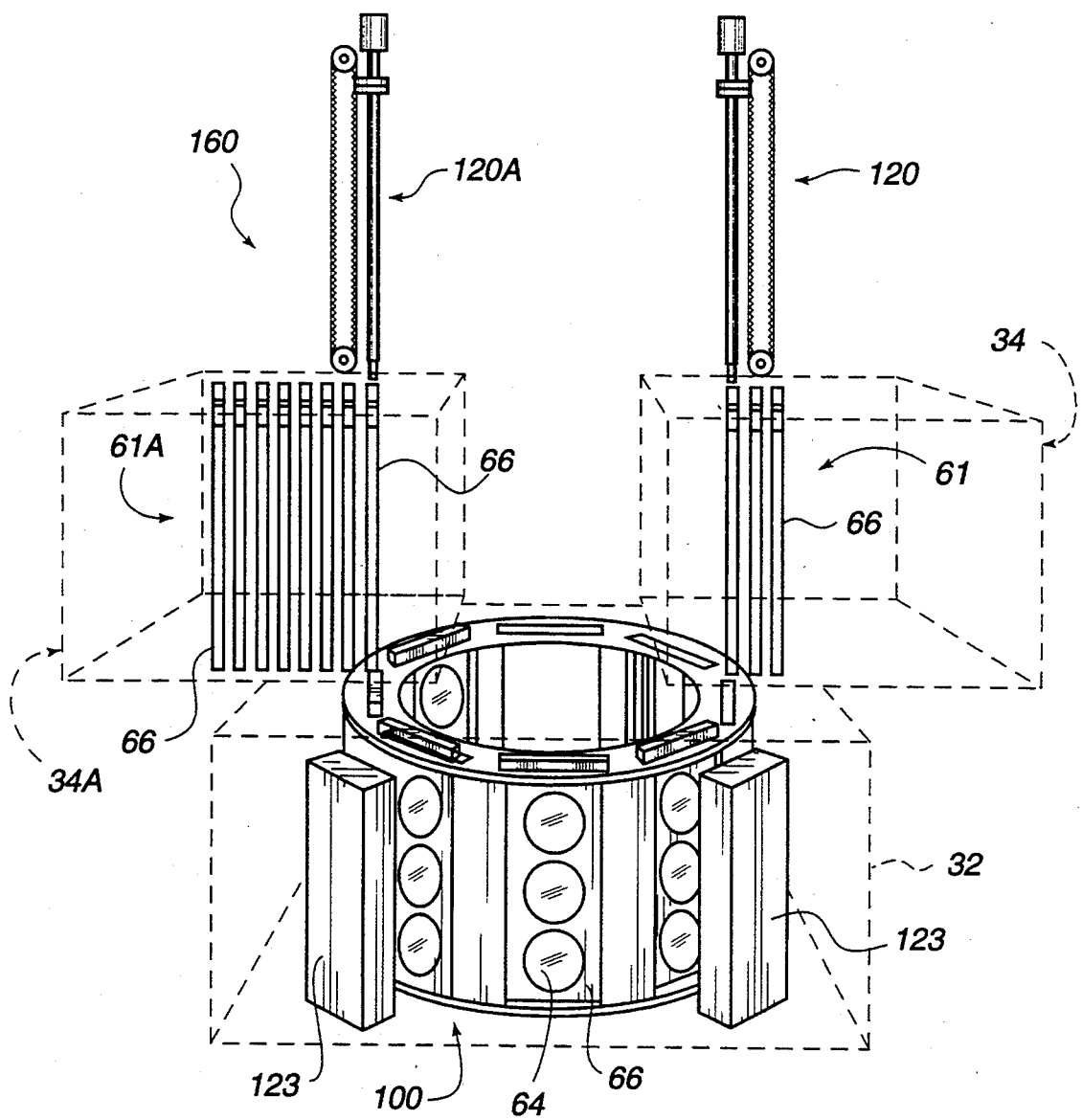
FIG. 8 is an exploded perspective view of the coating apparatus of FIG. 7.

FIGS. 7 and 8 depict apparatus 160 having a coating chamber 32, a load-lock chamber 34, similar to the load-lock chamber of apparatus 30, and an additional load-lock chamber 34A. Chamber 34A has an aperture (not shown) in the base thereof similar to aperture 40 of chamber 34 in apparatus 30. An additional aperture (not shown) in the top of chamber 32 is aligned with aperture 34 (in the same manner as aperture 36 is aligned with aperture 40 in apparatus 30), and in fluid communication therewith, via valve means 44A (see FIG. 7). Chamber 34A may be regarded simply as a mirror-image of chamber 32. In the drawings, component parts of chamber 34A are designated by the same reference numeral as equivalent components of chamber 32, with the addition of a suffix A.

A particular advantage of the apparatus 80 is that loading and unloading substrates into and out of substrate-transporter 100 in chamber 32 may be carried out in separate chambers. This can be effective in reducing loading and unloading time for the apparatus. Alternatively, substrates can be loaded and unloaded simultaneously from both chambers 34 and 34A, providing another means of speeding loading and unloading.

Figure 9:
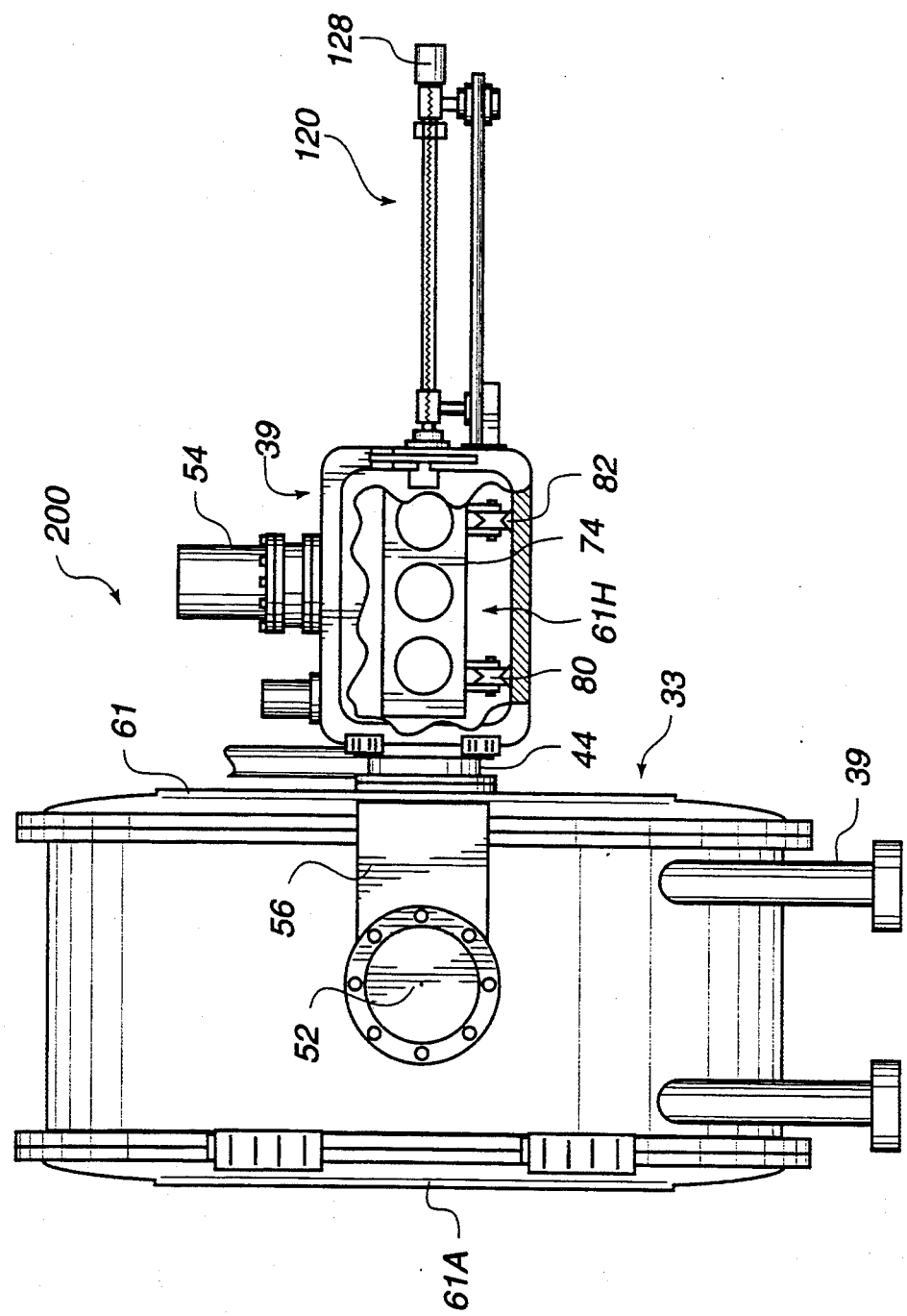
FIG. 9 is a front elevation view schematically illustrating yet another embodiment of coating apparatus in accordance with the present invention, including a horizontal cylindrical coating chamber and one load-lock chamber.
Figure 10:
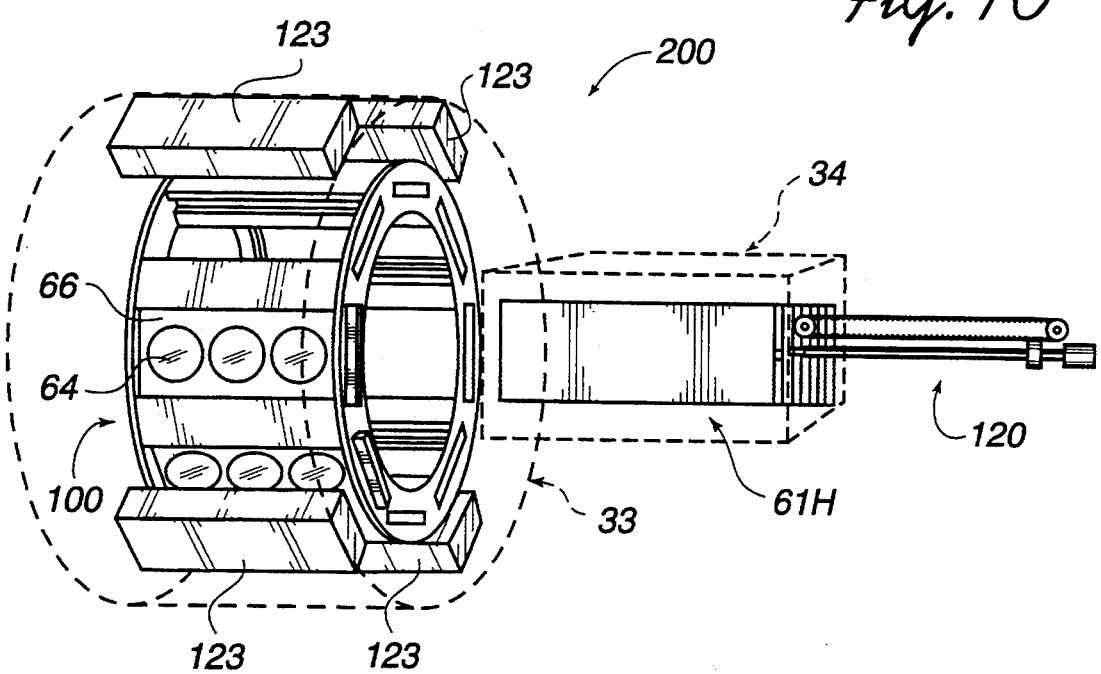
FIG. 10 is an exploded perspective view of the coating apparatus of FIG. 9.

In the above described embodiments of the present invention, coating chamber 32 is a box or cube-type chamber and substrate-transporter 100 is oriented vertically. This arrangement is preferred when coating chamber 32 has dimensions between about 0.75m and 1.25 m. For a coating chamber having dimensions greater than about 1.25 m, a horizontally oriented cylindrical coating chamber, in which a substrate-transporter is horizontally oriented, is preferred. One embodiment of such an apparatus 200, including a horizontal cylindrical coating chamber 33, is illustrated in FIGS. 9 and 10.

Cylindrical chamber 33 is supported on legs 39. Chamber 33 is provided with doors 61 and 61A, one at each end of the chamber. An aperture for communicating with load-lock chamber 34 is located in door 61. Load-lock chamber 34 and coating chamber 33 are in fluid communication via a high vacuum valve 44 as described above in other embodiments of the present invention. A magazine 61H for holding substrate-carriers 66 has wheels 80 attached to a side panel 74 of magazine 61H.

Figure 12:
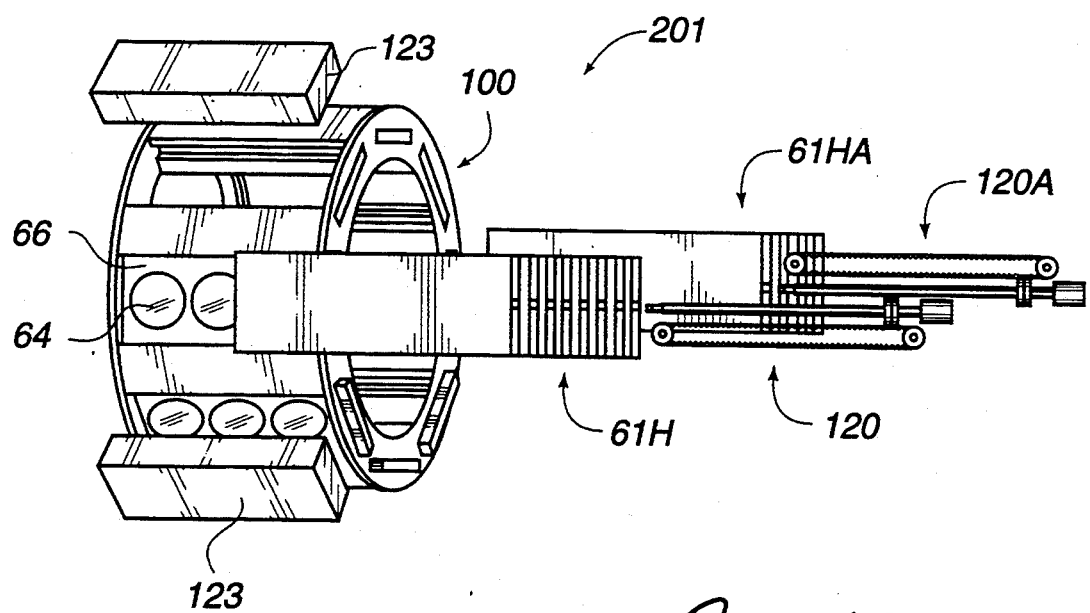
FIG. 12 is an exploded perspective view of the coating apparatus of FIG. 11.

FIGS. 11 and 12 illustrate a variation 201 of apparatus 200. Here, two load-lock chambers 34 and 34A, each located on one end 33A (on door 61) are provided. These load-lock chambers may be operated in the manner described above for apparatus 160.

Figure 13:
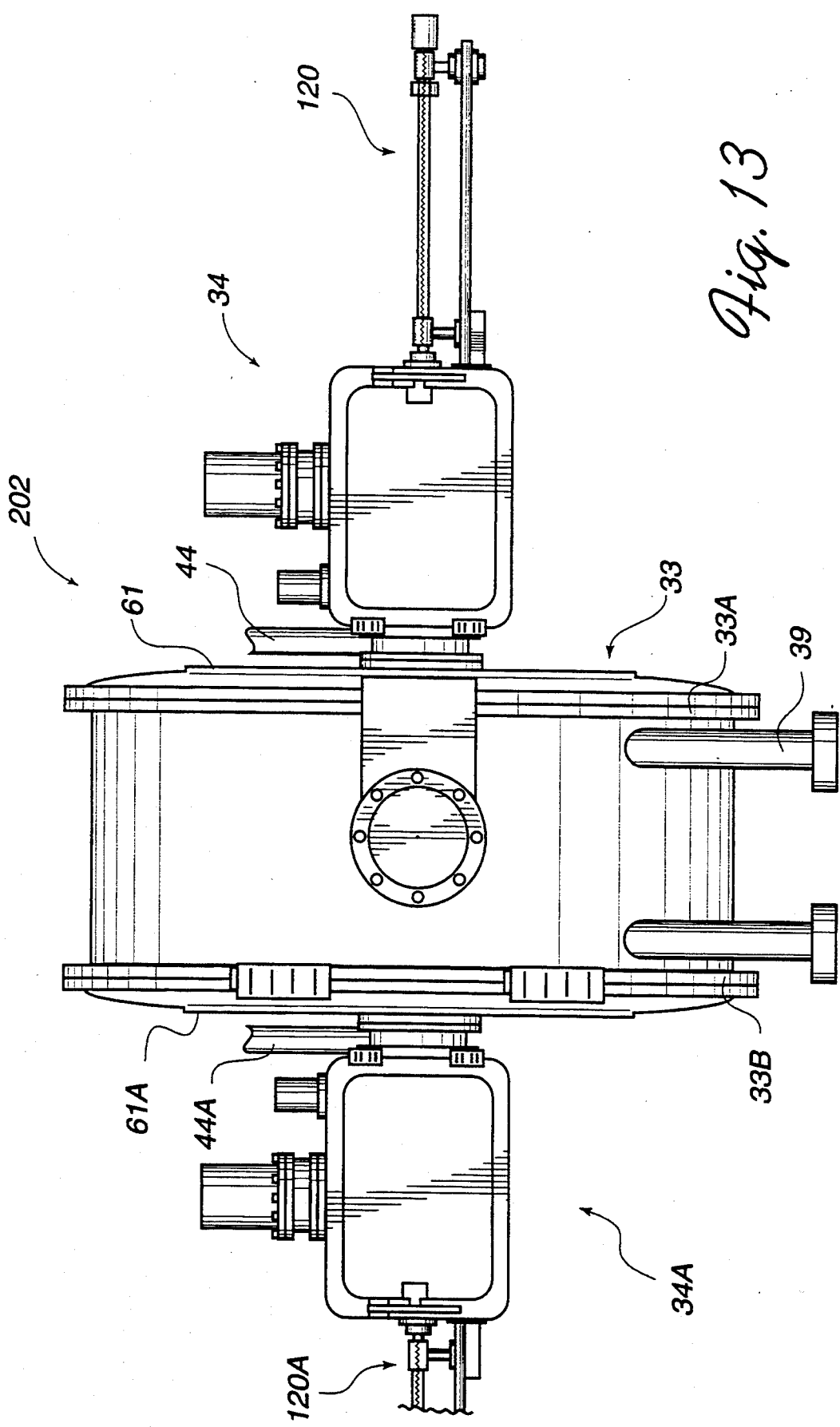
FIG. 13 is a front elevation view schematically illustrating a further embodiment of coating apparatus in accordance with the present invention, including a horizontal cylindrical coating chamber having a load-lock chamber located at each end thereof.
Figure 14:
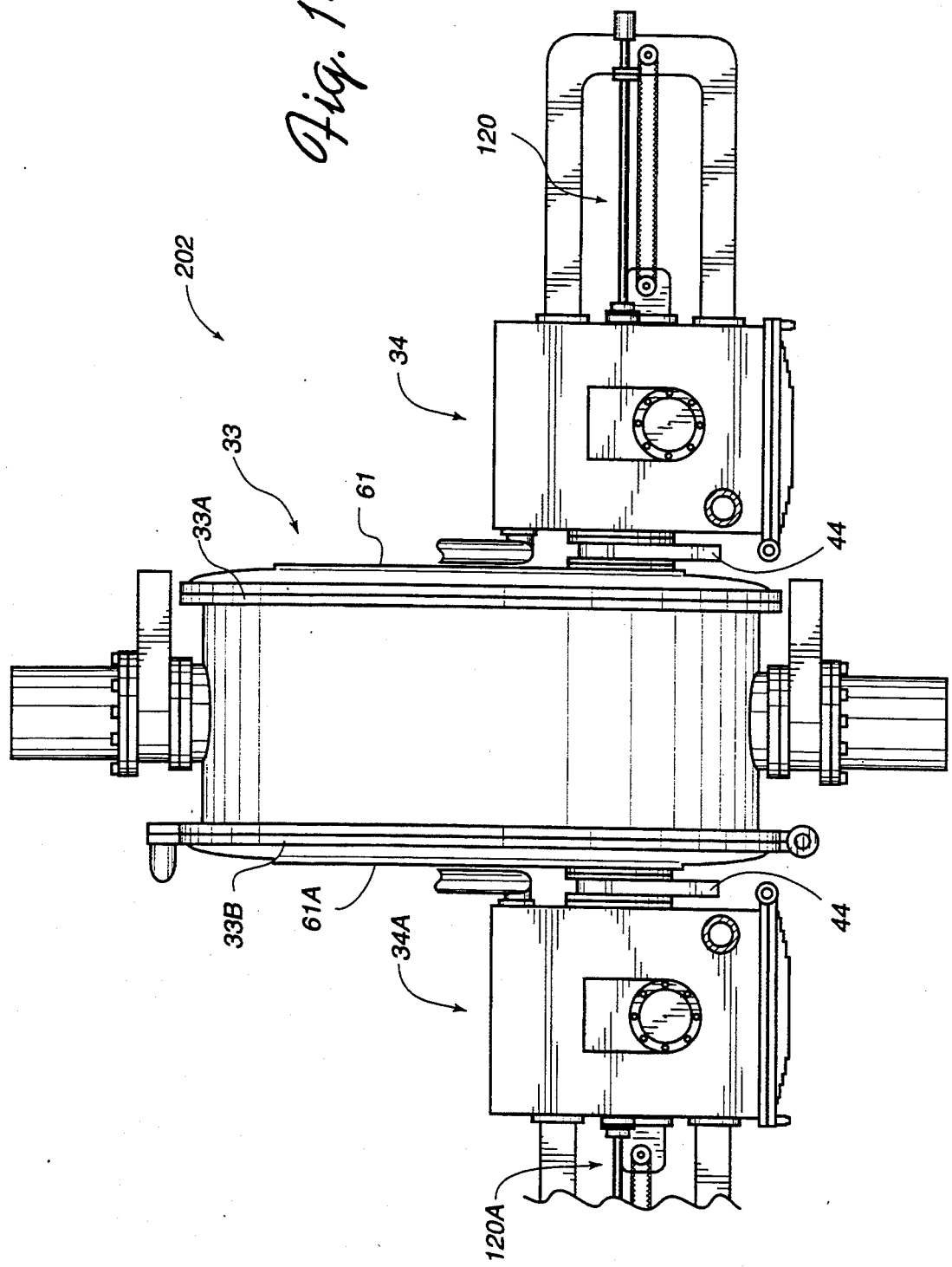
FIG. 14 is a plan view illustrating the coating apparatus of FIG. 13.
Figure 15:
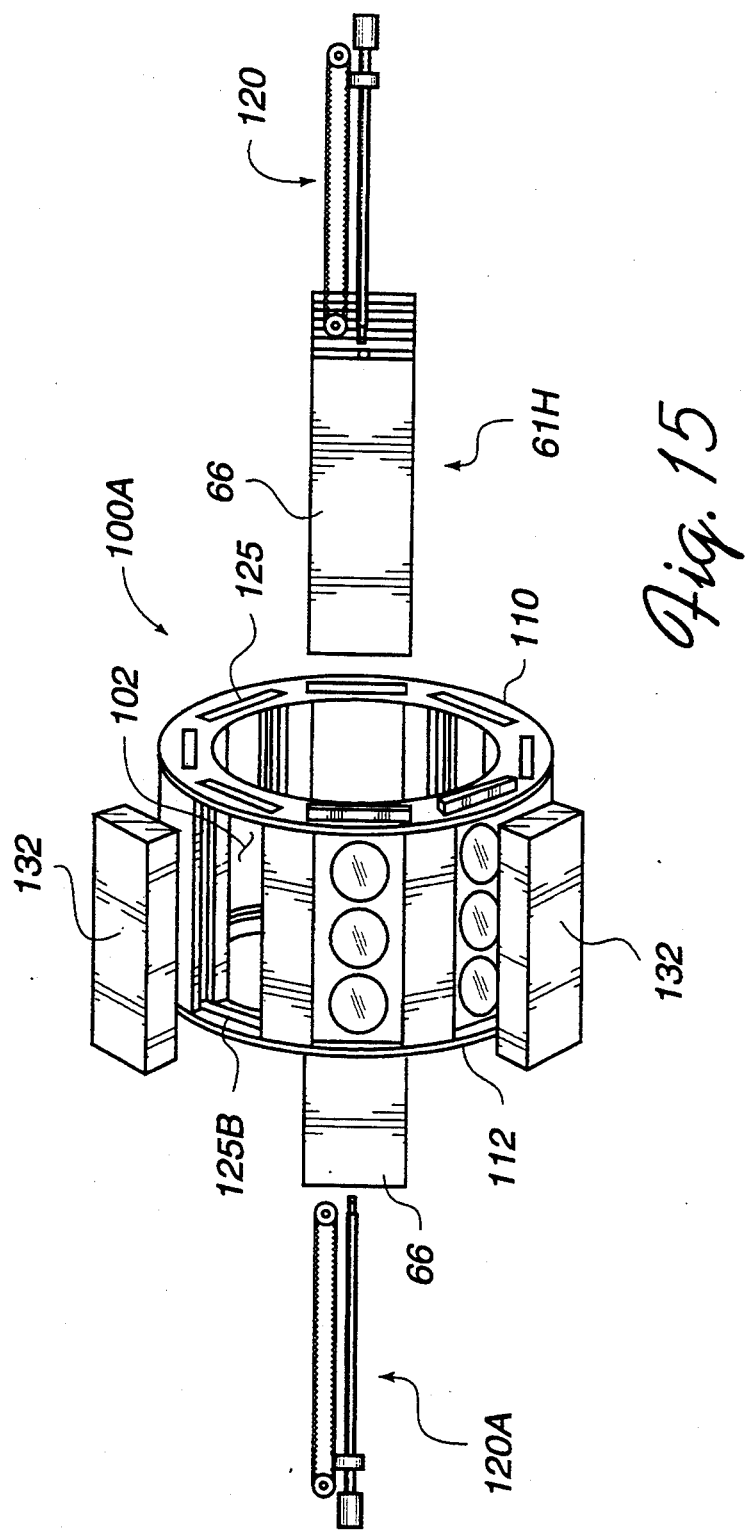
FIG. 15 is an exploded perspective view illustrating details of the coating apparatus of FIG. 13.

A preferred arrangement for apparatus including a horizontal cylindrical coating chamber is illustrated in FIGS. 13, 14, and 15. Here, apparatus 202 includes a load-lock chamber 34, located at one end 33A of horizontal cylindrical chamber 33, and a load-lock chamber 34A, located at opposite end 33B of chamber 33. Referring to FIG. 15, a transport-station of substrate-transporter 100A maybe accessed by either a slot 125 in annular member 110, or by a slot 125B annular member 112. This arrangement permits that a substrate-carrier 66 which is already in a transport-station 102 (following a coating operation), may be removed, via a slot 125B from the transport-station, while another substrate-carrier in inserted into the transport-station, via a slot 125. This permits rapid loading and unloading of substrates into coating chamber 33.

In all of the above-described embodiments of the present invention, substrates are transported past deposition sources 123 to receive one or more layers of a selected material or mixture of materials. The substrates are transported by rotating a generally cylinder or drum shaped substrate-transporter about a cylindric axis. Coating operations may be performed by operating the substrate-transporter according to any one of two preferred methods.

In a first method, each transport-station of the substrate-transporter contains a substrate-carrier including substrates to be coated. The substrate-transporter is rotated at a relatively high speed, for example, at about sixty revolutions per minute. At least one deposition source in the chamber is activated. A layer is deposited on the substrates by passing the substrates many times past the active deposition source (or sources). Preferably, it is arranged that each substrate passes a deposition source about one-hundred times during deposition of the layer.

This method offers two advantages. One advantage is that each substrate is exposed for only a short time to a deposition source, thus preventing excessive temperature increase of the substrate. This may be preferred, for example, for coatings on plastic. Another advantage is that two sources may be activated, each thereof depositing a different material, permitting a layer composed of a mixture of the two materials to be deposited. This may be required for example, to provide a layer having a desired refractive index value, or a particular mechanical property such as low stress.

A disadvantage of the method is that shutters must be provided to cover the deposition sources until a desired deposition rate is achieved and stabilized. When multiple layers of different materials are deposited, shuttering and rate stabilization must be carried out between each layer deposition, thus increasing total deposition cycle time.

Figure 16:
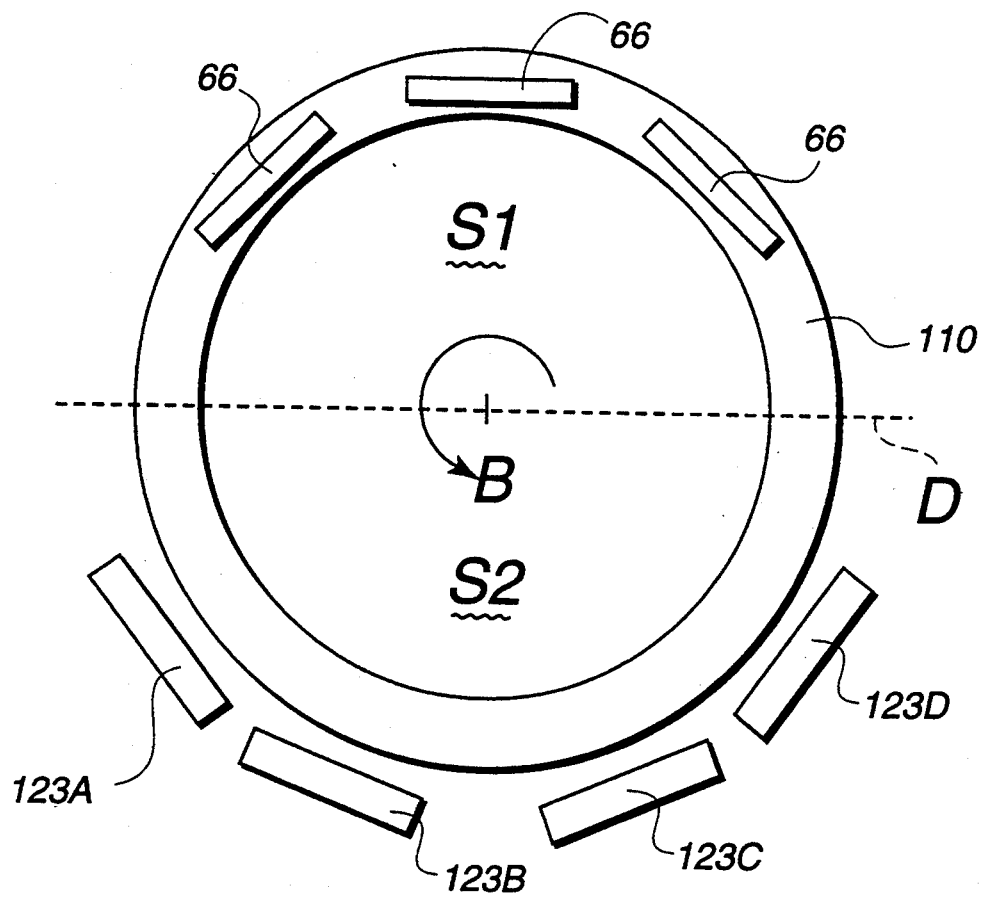
FIG. 16 schematically illustrates one method of operating apparatus in accordance with the present invention.

Referring now to FIG. 16, in another deposition method, a substrate-transporter 100 has substrate-carriers 66 located on only one side S1 of a diameter indicated by broken line D, i.e., around only one half of the periphery of substrate-transporter 100. At the start of a deposition cycle, the drum is stationary and arranged such that all deposition sources 123A–123D (four shown here) are all located on an opposite side S2 of diameter D, i.e., proximate the other half of the periphery of substrate-transporter 100. The sources may be arranged to deposit different materials at different rates. For example, sources 123A and 123C may deposit titanium dioxide, and sources 123B and 123D may deposit silicon dioxide.

The sources are first activated and stabilized at a predetermined rate for each thereof. Substrate-transporter 100 is then rotated, once, through 360°, as indicated by arrow B, such that all substrates pass sources 123A–123D in sequence, and return to their original starting position. By way of example, using deposition materials as described above, and a suitably chosen deposition rate for each source, layers of a well-known four-layer antireflection coating may be deposited. Those skilled in the art to which the present invention pertains will recognize that, operated in this manner, apparatus in accordance with the present invention becomes in essence a "circular in-line" coating apparatus.

The apparatus offers significant cost and operating advantages over a small-capacity conventional in-line coating apparatus. For example, one form of small-capacity in-line coating apparatus has five chambers, each generally separated by a slit valve or dynamic lock. A first chamber is used as a loading chamber, a second chamber is used as a buffer chamber, a third chamber is used as a coating chamber, a fourth chamber is used as buffer chamber, and a fifth chamber is used as an unloading-chamber. The chambers are typically the same size. The apparatus is long. The apparatus requires five chambers, at least five pumping systems and four dynamic lock valves.

Comparable apparatus according to the present invention, for example apparatus 202, requires only three chambers; a loading chamber; a coating chamber; and an unloading chamber. Only three pumping systems are required and two valves between chambers. Further using the magazine type loading and unloading system, loading and unloading chambers may be considerably smaller than the coating chamber, and accordingly, can require smaller pumping systems than the coating chamber. Apparatus in accordance with the present invention may thus be made significantly less expensive than a comparable conventional in-line apparatus. Further, it may be made significantly more compact, minimizing facility size and cost.

The present invention has been described in terms of a preferred and other embodiments. The invention is not limited, however, to the embodiments described and depicted. Rather, the invention is defined by the appended claims.

What is claimed is:

1. A vacuum coating apparatus, comprising:
    a first vacuum chamber, said first vacuum chamber being generally cylindrical and horizontally oriented and having first and second opposite ends;
    a generally cylinder-shaped, rotatable substrate-transporter located in said first vacuum chamber, said substrate-transporter including a plurality of elongated transport-stations arranged around the periphery thereof and extending therealong;
    a second vacuum chamber, said second vacuum chamber located at said first end of said first vacuum chamber and in fluid connection with said first vacuum chamber via a first aperture in said first vacuum chamber and a second aperture in said second vacuum chamber and via first valve means connecting said first and second apertures, said first and second apertures generally aligned with each other, and said first aperture located in said first vacuum chamber such that any one of said transport-stations may be generally aligned with said first and second apertures by rotating said substrate-transporter;
    a third vacuum chamber, said third vacuum chamber located at said second end of said first vacuum chamber and in fluid communication with said first vacuum chamber via a third aperture in said first vacuum chamber and a fourth aperture in said third vacuum chamber and via second valve means connecting said third and fourth apertures, said third and fourth apertures generally aligned with each other, and said third aperture located in said first vacuum chamber such that any one of said transport-stations may be generally aligned with said third and fourth apertures by rotating said substrate-transporter;
    said second and third vacuum chambers including respectively first and second magazine means for releasably holding a plurality of generally flat elongated rectangular substrate-carriers, said substrate-carriers for holding a predetermined number of substrates, said first and second magazine means each including a plurality of spaced-apart elongated holding-stations, each thereof for releasably holding one of said plurality of substrate-carriers;
    means for transporting said first magazine means linearly across said second aperture such that a selected one of said holding-stations may be aligned with a selected one of said transport-stations;
    injection means in said second vacuum chamber, said injection means for ejecting a selected substrate-carrier from the selected holding-station, transporting said selected substrate-carrier through said first and second apertures, and inserting said selected substrate-carrier into said selected transport-station;
    said third vacuum chamber including means for transporting said second magazine means linearly across said fourth aperture such that a selected one of said holding-stations may be aligned with the selected transport-station including the substrate-carrier; and
    said third vacuum chamber including withdrawal means, said withdrawal means for removing said selected substrate-carrier from said selected transport-station, transporting said selected substrate-carrier through said third and fourth apertures, and inserting said selected substrate-carrier into said selected holding-station.

2. The apparatus of claim 1, further including at least two elongated deposition-devices located proximate said substrate-transporter.

3. The apparatus of claim 1, further including at a plurality of elongated deposition-devices located proximate said substrate-transporter, said deposition-devices arranged such that all are located on the same side of a diameter of said substrate-transporter.

4. The apparatus of claim 3, wherein said deposition-devices are linear, planar magnetron sputtering-devices.

* * * * *